US011991870B1

(12) United States Patent
Nikkhoo et al.

(10) Patent No.: US 11,991,870 B1
(45) Date of Patent: May 21, 2024

(54) THERMAL INTERFACE MATERIAL FOR ELECTRONIC DEVICE

(71) Applicant: Meta Platforms Technologies, LLC, Menlo Park, CA (US)

(72) Inventors: Michael Nikkhoo, Saratoga, CA (US); Brian Toleno, Cupertino, CA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/814,184

(22) Filed: Jul. 21, 2022

Related U.S. Application Data

(60) Provisional application No. 63/306,906, filed on Feb. 4, 2022.

(51) Int. Cl.
*H05K 7/20* (2006.01)
*G06F 1/16* (2006.01)
*G06F 1/20* (2006.01)

(52) U.S. Cl.
CPC ......... *H05K 7/20945* (2013.01); *G06F 1/163* (2013.01); *G06F 1/206* (2013.01)

(58) Field of Classification Search
CPC ................................................. H05K 7/20945
See application file for complete search history.

(56) References Cited

U.S. PATENT DOCUMENTS

| | | | |
|---|---|---|---|
| 6,286,591 B1 | 9/2001 | Bonneville | |
| 6,652,958 B2 * | 11/2003 | Tobita | D01F 9/145 977/788 |
| 2012/0048528 A1 | 3/2012 | Bergin et al. | |
| 2015/0192971 A1 | 7/2015 | Shah | |
| 2018/0136703 A1 | 5/2018 | Woods et al. | |
| 2018/0376626 A1 * | 12/2018 | Hurbi | G02B 7/002 |
| 2021/0373628 A1 | 12/2021 | Lin et al. | |

FOREIGN PATENT DOCUMENTS

WO    2021021294 A1    2/2021

OTHER PUBLICATIONS

International Search Report and Written Opinion for International Application No. PCT/US2023/012353, dated May 12, 2023, 14 pages.

* cited by examiner

*Primary Examiner* — Mukundbhai G Patel
(74) *Attorney, Agent, or Firm* — Jordan IP Law, LLC

(57) ABSTRACT

An electronic device includes an electronic component, a thermal ground, and a thermal interface material having a first side coupled to the electronic component and a second side coupled to the thermal ground, such that the thermal interface material draws thermal energy from the electronic component and transfers thermal energy to the thermal ground. The thermal interface material includes a body comprising thermally conductive silicone, the body disposed in thermal contact with the electrical component, and the thermally conductive silicone having a first thermal conductivity, and a plurality of thermally conductive fibers disposed within the body of the thermal interface material, the thermally conductive fibers having a second thermal conductivity greater than the first thermal conductivity.

20 Claims, 5 Drawing Sheets

THERMAL INTERFACE MATERIAL FOR ELECTRONIC DEVICE

CROSS-REFERENCE TO RELATED APPLICATION

This application claims the benefit of priority to U.S. Provisional Application No. 63/306,906, filed Feb. 4, 2022, which is incorporated by reference herein in its entirety.

BACKGROUND

Electronic components of electronic devices generate heat during operation. The amount of heat generated by components of an electronic device is generally related to a processing capability of such components as they consume electrical power and output heat while operating. As such, a temperature of the device and components thereof is often managed through various types of thermal management systems that draw heat away from components of the device, spread heat throughout the device, and/or expel heat from the device. These thermal management systems are designed to maintain the temperature of components of the device within given operating ranges to ensure proper function of the components within the device. However, existing thermal management systems take up space, add weight, and may therefore not be well suited for use in certain electronic devices, such as wearable devices.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
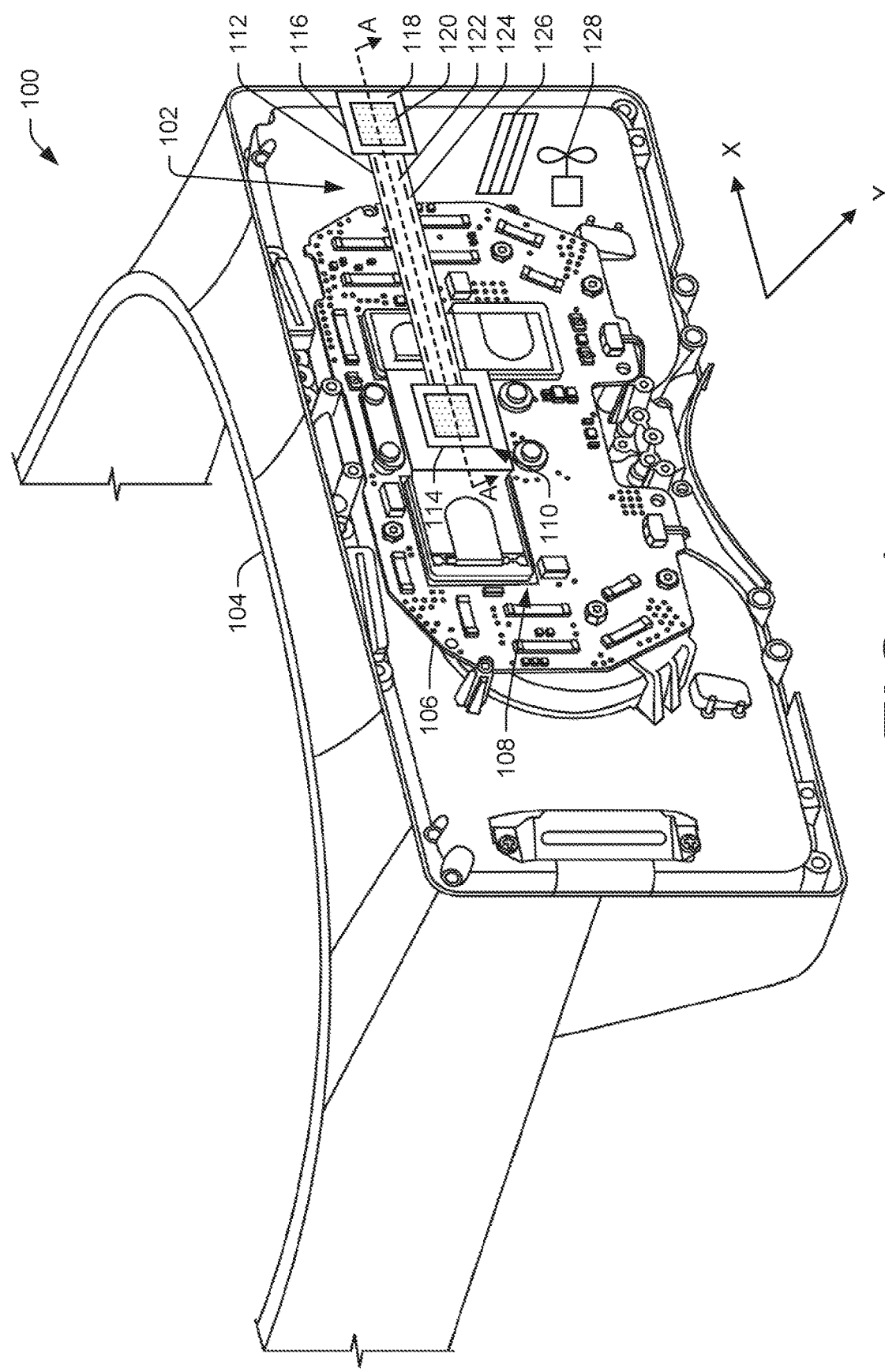
FIG. 1 illustrates a perspective view of an example electronic device having a thermal management system in accordance with an example of the present disclosure.

Electronic devices generate heat from various components and, as such, it is important to manage temperatures of the components of the electronic device. This application describes a thermal management system for managing a temperature of an electronic device and/or components thereof. The thermal management system may include thermal interface material disposed within a housing of the electronic device and configured to draw thermal energy from component(s) of the electronic device. The thermal interface material described herein may include a first material forming a body of the thermal interface material and a second material disposed within the body of the thermal interface material. The second material may include a plurality of thermally conductive fibers that are aligned within the body of the thermal interface material. By aligning the plurality of thermally conductive fibers and sizing such thermally conductive fibers to extend substantially across a dimension of the body of the thermal interface material, a thermal energy pathway is formed by which thermal energy may be efficiently transferred across the thermal interface material. Furthermore, the thermal energy may be transferred across the thermal interface material via conduction as the thermal energy is transferred along a length of individual thermally conductive fibers of the plurality of thermally conductive fibers. As such, the thermal interface material described herein may transfer thermal energy with greater efficiency than conventional thermal interface material that includes added particles The thermal management system may be configured to manage a temperature of one or more components of the electronic device by drawing thermal energy from the component(s) via the thermal interface material and transferring thermal energy between components of an electronic device via the thermal interface material and/or a thermal conduit coupled to the thermal interface material.

For example, the thermal interface material may draw thermal energy from thermal energy generating component(s) of the electronic device and transfer the thermal energy to a thermal ground such as a housing, heat sink, thermal spreader, vapor chamber, thermal ground, or other component of the electronic device. The housing (or other thermal ground) may disperse the thermal energy evenly throughout the electronic device and/or to an environment surrounding the electronic device, or may transfer the thermal energy to a heat sink or other thermal ground.

In some examples, the thermal management system may evenly disperse thermal energy to the housing, heat sink, and/or thermal ground so as to prevent hotspots from forming on an exterior surface of the housing. Such hotspots on the housing may cause user discomfort when the electronic device is secured to the user, is held by the user, or otherwise contacted by the user. Additionally, or alternatively, the thermal management system described herein may unevenly direct thermal energy to the housing, heat sink, and/or thermal ground in order to reduce a temperature of the housing at locations where the housing contacts a user when the electronic device is secured to the user.

For example, when the electronic device includes a wearable headset, glasses, or other face or head mounted device, the thermal management system may draw thermal energy away from a face of the user and direct the thermal energy to a temple region (or other portion of the wearable headset) of the user. As such, the thermal management system may draw thermal energy away from particularly sensitive regions of a user and direct the thermal energy to portions of the device that are located proximate less sensitive regions of the user or portions of the device that are not in contact with the user.

In some examples, the thermal management system may be used in electronic devices such as, but not limited to, a head-mounted device (e.g., an electronic headset device, glasses, etc.) or other wearable device. Such head-mounted devices are referred to herein as "headsets" and may include extended reality headsets that allow users to view, create, consume, and share media content. In some examples, the headsets may include a display structure having a display which is placed over eyes of a user and allows the user to "see" the extended reality. As discussed further below, the term "extended reality" includes virtual reality, mixed reality, and/or augmented reality.

As used herein, the term "virtual environment" or "extended reality environment" refers to a simulated environment in which users can fully or partially immerse themselves. For example, an extended reality environment can comprise virtual reality, augmented reality, mixed reality, etc. An extended reality environment can include objects and elements with which a user can interact. In many cases, a user participates in an extended reality environment using a computing device, such as a dedicated extended reality device. As used herein, the term "extended reality device" refers to a computing device having extended reality capabilities and/or features. In particular, an extended reality device can refer to a computing device that can include any device capable of presenting a full or partial extended reality environment.

Additionally, and/or alternatively, the thermal management system may be used in devices, such as, but not limited to, a wrist wearable device (e.g., a smartwatch or controller), a hand wearable device, a head-mounted device (e.g., glasses, an electronic headset device), or other wearable devices. Examples of wrist wearable devices may include smartwatches that may execute mobile applications, mobile operating system(s), output media content, provide connectivity to one or more other devices (e.g., via Wi-Fi, mobile networks, Bluetooth®, global positioning system (GPS), etc.), monitor health or fitness (and associated metrics) of a user, among other operations. The wearable device described herein may also include a display and touchscreen interface that allows users to view, create, consume, and share media content. Furthermore, the wearable device described herein may be connected to one or more other devices and may be configured to control one or more functions of the other devices based in part on user input received via the wearable device.

While examples of electronic devices are provided above, it is to be understood that the thermal management system described herein may be implemented in any type of electronic device including, but not limited to, mobile phones (e.g., cell phones, smart phones, etc.), tablet computing devices, electronic book reader devices, laptop or all-in-one computers, media players, portable gaming devices, televisions, monitors, cameras, wearable computing devices, electronic picture frames, audio virtual assistant devices, radios, speakers, personal computers, external hard drives, input/output devices (e.g., remote controls, game controllers, keyboards, mice, touch pads, microphones, speakers, etc.), and/or the like.

In some examples, the electronic device may include a housing configured to house one or more components of the wearable device. For example, the electronic device may include one or more printed circuit boards (PCBs) disposed within the housing. In some examples, one or more electronic components may be disposed on or coupled to the PCB(s). For example, the PCB(s) may include one or more integrated circuits coupled thereto. The PCB(s) may further include memory, processor(s), circuitry, or other electronic components coupled hereto. In some examples, components of the thermal management system may be coupled directly or indirectly to one or more electronic components such that such components of the thermal management system are disposed in thermal contact with the one or more electronic components.

For example, the thermal management system may include thermal interface material coupled directly or indirectly to the one or more electronic components such that the thermal interface material is thermally coupled to the one or more electronic components. In such an example, the thermal interface material may be configured to draw thermal energy form the one or more electronic components and to transfer the thermal energy to a thermal ground (or other component) of the electronic device. Additionally, or alternatively, components of the thermal management system can be disposed in thermal contact with one or more heat sinks, thermal spreaders, etc. associated with the one or more electronic components. In either example, the thermal management system may be configured to draw thermal energy from the one or more electronic components (and/or associated heat sinks) and to transfer the thermal energy to other components of the electronic device.

In some examples, such other components to which thermal energy is transferred may include the housing of the electronic device. For example, the thermal management system may draw thermal energy from an electronic component (or other thermal energy generating component) that generates thermal energy and may transfer the thermal energy to the housing where the thermal energy is dispersed to an environment surrounding the electronic device. In some examples, such other components may additionally, or alternatively include one or more thermal frames, thermal grounds, additional heat sinks, cooling blocks, radiators, vapor chambers, or other components configured to manage thermal energy within the electronic device.

In some examples, the thermal interface material includes a first material and a second material that form the thermal interface material. For example, the thermal interface material may include a body comprising a thermally conductive silicone matrix. However, in some examples, the first material may be a polymer. For example, the first material may include various types of polymers including, but not limited to, polyamide (PA) (such as nylon), polyvinyl chloride (PVC), polycarbonate (PC), polystyrene (PS), acrylonitrile butadiene styrene (ABS), polymethyl methacrylate (PMMA), and thermoplastic elastomers (TPEs), polyetherimide (PEI), polyetheretherketone (PEEK), polybutylene terephthalate (PBT), polyphenylene sulfide (PPS), liquid crystal polymer (LCP), combinations thereof, and/or other types of polymers.

The body of the thermal interface material may be compressible such that the body may conform to various complex shapes or geometries of an electronic device and/or components thereof. By compressing the body of the thermal interface material, the body may fill any air gaps between the body and an adjacent component or portion of the electronic device, thereby increasing thermal conductivity therebetween. For example, the body of the thermal interface material may be compressed within a housing of the electronic device, thereby eliminating gaps between the housing and the body of the thermal interface material, which, in turn, improves thermal conductivity therebetween.

The thermal interface material may also include a plurality of thermally conductive fibers disposed within the body of the thermal interface material. In some examples, the thermally conductive silicone matrix may include a first thermal conductivity and the plurality of thermally conductive fibers may include a second thermal conductivity that is greater than the first thermal conductivity. In some examples, the thermally conductive fibers may have a higher thermal conductivity in an axial direction (along their length) than in a radial direction (perpendicular to their length). As such, the plurality of thermally conductive fibers may improve the thermal conductivity of the thermal interface material in at least a direction parallel to a direction in which the thermally conductive fibers are oriented.

Furthermore, in some examples, the plurality of thermally conductive fibers may be aligned such that individual thermally conductive fibers of the plurality of conductive fibers include a length extending in a same (or a substantially similar) direction. Furthermore, the length of the individual thermally conductive fibers may extend across (or substantially across) a dimension (e.g., thickness, length, width, or height) of the body of the thermal interface material.

In conventional thermal interface material, added materials may be used to improve thermal conductivity of the thermal interface material. For example, silver particles, metal oxides (e.g., aluminum oxide, aluminum nitride, etc.), metal coated particles, or other added materials may be added to the silicone matrix (or other material) in an effort to improve the overall thermal conductivity of the thermal interface material. However, such added materials are often randomly distributed within the silicone matrix. As such, thermal energy may be transferred between various particles via radiation. In such an example, the transfer of thermal energy may experience inefficiencies as thermal energy radiates between particles. As such, conventional thermal interface material may include a thermal conductivity with a K-value (i.e., watts per meter-Kelvin (W/m-K)) between approximately 1 and 10.

Conversely, by aligning the plurality of thermally conductive fibers and sizing such thermally conductive fibers to extend substantially across a dimension of the body of the thermal interface material, a thermal energy pathway is formed by which thermal energy may be efficiently transferred across the thermal interface material. Furthermore, the thermal energy may be transferred across the thermal interface material via conduction as the thermal energy is transferred along a length of individual thermally conductive fibers of the plurality of thermally conductive fibers. As such, the thermal interface material described herein may transfer thermal energy with greater efficiency than conventional thermal interface material that includes added particles.

In some examples, the thermal interface material may be formed by extruding the first material and the plurality of thermally conductive fibers through an extrusion die. By extruding the first material and the plurality of thermally conductive fibers through the extrusion die, shear forces are imparted on the first material and the plurality of thermally conductive fibers which causes the plurality of thermally conductive fibers to align within he first material. Furthermore, in some examples, the extrusion die may include one or more magnets, electric current, or changing electric field to create a magnetic field which may further assist the alignment of the plurality of thermally conductive fibers within the first material. The extruded material results in the thermal interface material described herein and the extruded material may be cut to a desired size.

Furthermore, the plurality of thermally conductive fibers may include carbon fibers or graphite fibers. As mentioned previously, the thermal conductivity of the plurality of thermally conductive fibers is greater than the thermal conductivity of the thermally conductive silicone. As such, the plurality of thermally conductive fibers may improve the thermal conductivity of the thermal interface material. Additionally, the plurality of thermally conductive fibers being aligned in the body of the thermal interface material may provide better thermal conductivity with a lower packing density (or percent volume) compared to the conventional thermal interface material with the added particles. In such an example, the thermal interface material described herein may include a thermal conductivity with a K-value between approximately 20 and approximately 70 or between approximately 30 and approximately 50. However, it is to be understood that the K-values of the thermal interface material may be greater than or less than the ranges described previously.

Furthermore, in some examples, at least a portion of the thermal interface may be coated (or laminated) with an electrically conductive material. By coating at least a portion of the thermal interface material with the electrically conductive material, the thermal interface material may provide electrical grounding or shunting for electrical current within the electronic device. Additionally, or alternatively, individual thermally conductive fibers of the plurality of thermally conductive fibers may be at least partially coated with an electrically conductive material to provide electrical grounding or shunting.

In some examples, the electronic device may include multiple portions (or pieces) of thermal interface material disposed at various locations within the electronic device. Furthermore, in some examples, the electronic device may include thermal conduit disposed between multiple portions of the thermal interface material. The thermal conduit may be configured to conduct thermal energy between portions of the thermal interface material. For example, a first portion of thermal interface material may be disposed in thermal contact with a thermal energy generating component (e.g., a processor) and may be disposed in contact with the thermal conduit. The first portion of the thermal interface material may draw thermal energy from the thermal energy generating component and may transfer the thermal energy to the thermal conduit. The thermal conduit may transfer the thermal energy to a second portion of the thermal interface material. In some examples, the second portion of the thermal interface material may be disposed in thermal contact with a housing of the electronic device, one or more thermal frames, thermal grounds, additional heat sinks, cooling blocks, radiators, vapor chambers, or other components configured to manage thermal energy within the electronic device.

In some examples, the thermal interface material may be overmolded (or otherwise disposed) on ends of the thermal conduit. For example, the thermal interface material may include a first portion that is overmolded on a first end of the thermal conduit such that the first portion is molded over at least a portion of the first material and the second material. The thermal interface material may also include a second portion that is overmolded on a second end of the thermal conduit such that the second portion is molded over at least a portion of the first material and the second material. In some examples, the first portion and the second portion of the thermal interface material may form a first end and a second end of the thermal conduit, respectively.

In some examples, portion(s) of the thermal interface material may be coupled to or otherwise disposed in contact with components of the electronic device. For example, a first portion of the thermal interface material may be coupled to a processor, radio, display, driver, memory, battery (or other thermal energy generating component) while a second portion of the thermal interface material may be coupled to a housing of the electronic device such that the thermal conduit draws thermal energy from the thermal energy generating component (through the first portion of the thermal interface material) and transfers the thermal energy to the housing (via the second portion of the thermal interface material).

Furthermore, the thermal interface material may be compressible such that the thermal interface material may conform to various complex shapes or geometries of an electronic device and/or components thereof. By compressing the thermal interface material, the thermal interface material may fill any air gaps between the thermal interface material and an adjacent component or portion of the electronic device, thereby increasing thermal conductivity therebetween. Following the example given above, the second portion of the thermal interface material may be compressed within a housing of the electronic device, thereby eliminating gaps between the housing and the second portion of the thermal interface material, which, in turn, improves thermal conductivity therebetween.

In some examples, the thermal conduit is formed from a first material at least partially covered or encased by a second material. The thermal conduit may be strong, flexible, light, and highly-thermally conductive. In some examples, the first material is formed from a highly thermally conductive material such as pyrolytic graphite or other thermally conductive material. The pyrolytic graphite may form a core of the conduit as the pyrolytic graphite includes a high thermal conductivity. As such, as the thermal conduit draws thermal energy from one or more components of the electronic device, the thermal energy may be efficiently and quickly transferred across the first material. While the thermal conduit is described as being formed by a first material and a second material, it is to be understood that, in some examples, the thermal conduit may be formed from a single material.

In some examples, the second material is bonded, adhered, or otherwise coupled to the first material. The second material may coat or encase the first material such that a length of the second material is substantially equal to the first material. In some examples, the second material may be applied to a top, bottom, and/or sides of the first material and may be applied along substantially an entire length of the first material. Alternatively, the second material may be applied to a portion of the length of the first material (e.g., less than an entire length of the first material) and/or the second material may be applied to less than all sides of the first material (e.g., the second material may be applied to a top and bottom of the first material but not the sides). Furthermore, end surfaces of the first material may be substantially free from the second material. In some examples, keeping the end surfaces of the first material free from the second material allows the first material to be disposed in direct thermal contact with other components (such as the thermal interface material described herein) of the thermal conduit. In some examples, the second material may stop short of the ends of the first material to provide additional contact area around the perimeter of the first material to contact the thermal interface material or other components/materials.

These and other aspects are described further below with reference to the accompanying drawings and appendices. The drawings are merely example implementations and should not be construed to limit the scope of the claims. For example, while examples are illustrated in the context of a head-mounted electronic device, the techniques may be used in association with any electronic device including, but not limited to, those described at various locations throughout this application.

FIG. 1 illustrates a perspective view of an example electronic device 100 having a thermal management system 102. In some examples, the thermal management system 102 is located within a housing 104 of the electronic device 100.

While FIG. 1 shows the housing 104 as being open ended (i.e., not having a front portion of the housing), it is to be understood that the housing 104 may include a front portion such that the electronic device 100 is enclosed via the housing 104, and the electronic device 100 is merely shown without the front portion to show the various components located within the housing 104. As mentioned previously, the thermal management system 102 may be configured to draw thermal energy from one or more components of the electronic device 100 and to transfer the thermal energy to an environment surrounding the electronic device 100, a thermal ground, heat sink, housing 104, or other location within the electronic device 100 or outside of the electronic device 100.

In some examples, the electronic device 100 includes a printed circuit board (PCB) having one or more electronic components 108 coupled thereto. The one or more electronic components 108 may be coupled to the PCB 106 such that some and/or all of the one or more electronic components 108 are electrically and/or communicatively coupled to one another. Furthermore, the PCB 106 provides a substrate to which the one or more electronic components 108 are mounted within the housing 104 of the electronic device 100. Such electronic components 108 may include, but are not limited to, one or more central processing units (CPUs), graphics processing units (GPUs), holographic processors, radio frequency (RF) transceivers, display driver integrated circuits (DDIC) or other display drivers, memory, batteries or other power sources, global positioning systems (GPS), sensors, speakers, etc. Examples of RF transceivers may be configured to receive and/or transmit RF signals associated with Wi-Fi™, Bluetooth®, 3G, 4G, LTE, 5G, or other wireless data transmission technologies. In some examples, the sensors may include one or more microphones, light sensors, near field communication (NFC) systems, buttons, touch sensors, accelerometers, gyroscopes, magnetometers, inertial sensors, heart rate sensors, oxygen sensors, temperature sensors, moisture sensors, etc.

In some examples, the thermal management system 102 includes thermal interface material 110 material disposed within the housing 104 of the electronic device 100. The thermal interface material 110 may be disposed in direct or indirect thermal contact with the one or more electronic components 108 that are mounted on the PCB 106. In some examples, the thermal interface material 110 may also be disposed in direct or indirect thermal contact with the housing 104, a thermal ground, heat sink, thermal frame, vapor chamber, or other component of the electronic device 100. In such an example, the thermal interface material may draw thermal energy from the one or more electronic components 108 and may transfer the thermal energy to another component of the electronic device 100.

In some examples, the thermal management system 102 may include multiple portions (or pieces) of thermal interface material 110 disposed within the electronic device 100 that are connected via thermal conduit 112. For example, the thermal management system 102 may include a first portion 114 of thermal interface material 110. The first portion 114 of the thermal interface material 110 may be disposed in direct or indirect thermal contact with one or more electronic components 108. The thermal management system 102 may also include a second portion 116 of thermal interface material 110 that may be disposed in direct or indirect thermal contact with a thermal ground (such as the housing 104 or other component) of the electronic device 100. The thermal management system 102 may further include thermal conduit 112 disposed in contact with the first portion 114 and the second portion 116 of the thermal interface material 110 and the thermal conduit 112 may be sized to span a distance between the first portion 114 and the second portion 116 of the thermal interface material 110.

In such an example, the first portion 114 of the thermal interface material 110 draws thermal energy from the one or more electronic components 108 and transfers the thermal energy to the thermal conduit 112. The thermal conduit 112 conducts the thermal energy to the second portion 116 of the thermal interface material 110 where the second portion 116 of the thermal interface material 110 transfers the thermal energy to the thermal ground (such as the housing 104 or other component) where the thermal ground may receive, store, and/or disperse thermal energy.

In some examples, the thermal interface material 110 may include a first material 118 and a second material 120 that form the thermal interface material 110. For example, the first material 118 of the thermal interface material 110 may include a body comprising a thermally conductive silicone matrix (shown and described further herein with respect to FIGS. 2-4). Additionally, or alternatively, in some examples, the first material 118 may be a polymer. Furthermore, the second material 120 of the thermal interface material 110 may include a plurality of thermally conductive fibers (shown and described further herein with respect to FIGS. 2-4) disposed within the body of the thermal interface material 110. In some examples, the first material 118 may include a first thermal conductivity and the second material 120 may include a second thermal conductivity that is greater than the first thermal conductivity. As such, the second material 120 may improve the thermal conductivity of the first material 118.

In some examples, the thermal conduit 112 may be flexible such that the thermal conduit 112 may take any shape and may be implemented in complex geometries within an electronic device. The thermal conduit 112 may include a first material 122 that is at least partially encased by a second material 124. The thermal conduit 112 may provide a strong, flexible, light, and highly-thermally conductive pathway across which thermal energy may be transferred quickly and efficiently between the first portion 114 and the second portion 116 of the thermal interface material 110.

Furthermore, it is noted that the thermal management system 102 and components thereof are not shown to scale and the thermal interface material 110 and the thermal conduit 112 may be formed from relatively small components (example dimensions will be described further herein). Due to the strength, flexibility, small size, light weight, and thermal efficiency of the thermal interface material 110 and/or the thermal conduit 112, the thermal management system 102 described herein may be used to transfer thermal energy through complex geometries of the electronic device 100.

In some examples, the thermal management system 102 may include one or more vents 126 formed in the housing 104. The one or more vents 126 may be disposed in any portion of the housing 104. Furthermore, the one or more vents 126 may instead be slots, louvres, or other apertures. The one or more vents 126 may allow thermal energy located within the housing 104 to be dissipated to an environment outside of the housing 104. The thermal management system 102 may also include one or more fans 128 that are located within the housing 104 of the electronic device 100. The one or more fans 128 may be oriented to blow air across the second portion 116 of the thermal interface material 110 and/or to force air out of the one or more vents 126 to dissipate thermal energy to an environment surrounding the electronic device 100. Furthermore, in some examples, the one or more fans 128 may direct airflow throughout the electronic device 100.

Figure 2:
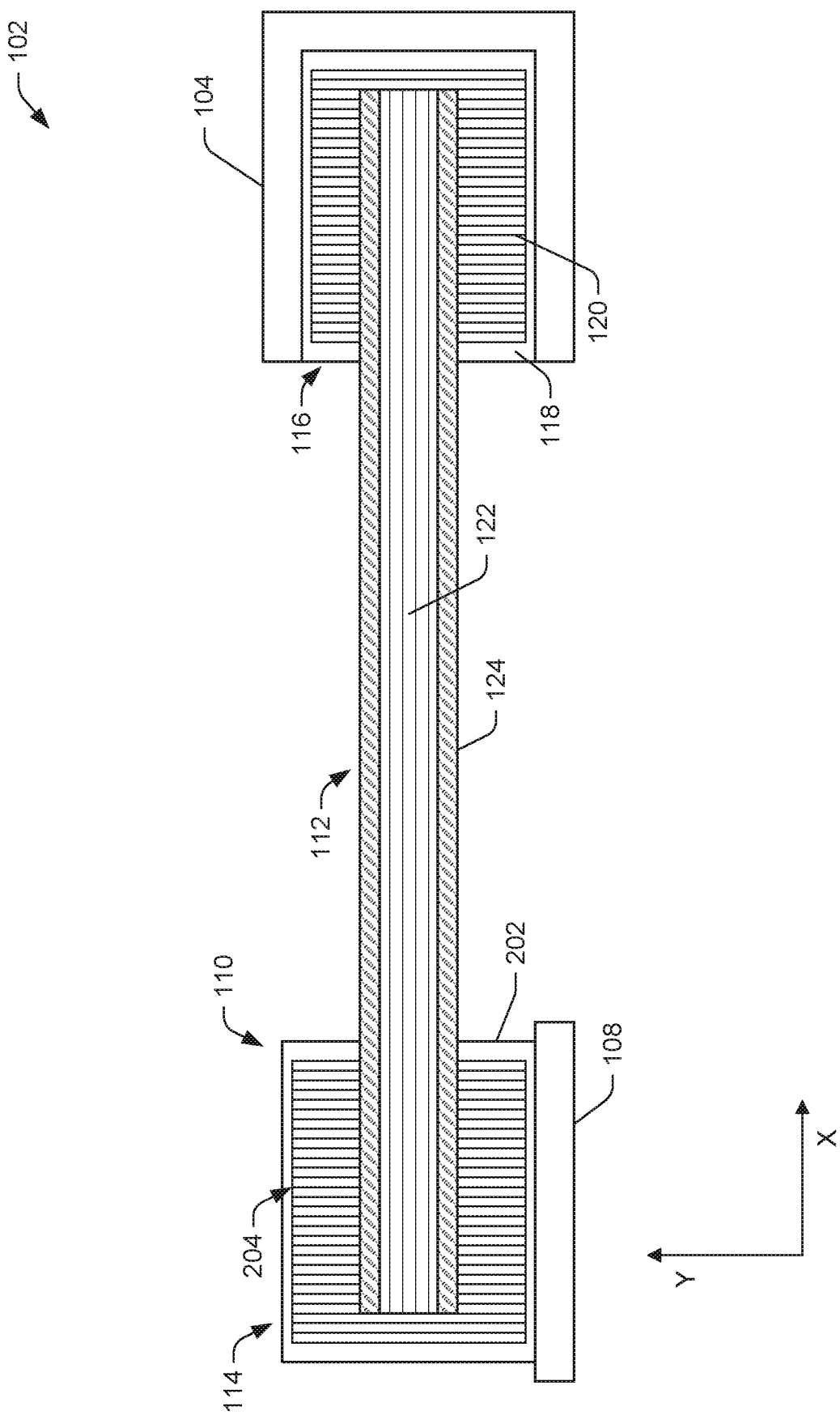
FIG. 2 illustrates a schematic cross-sectional view of a thermal management system in accordance with an example of the present disclosure.

FIG. 2 illustrates a schematic cross section of the thermal interface material 110 and the thermal conduit 112, taken along line A-A, as shown and described in FIG. 1. It is noted that FIG. 2 is not drawn to scale and various components illustrated in FIG. 2 may be relatively larger or smaller than depicted.

As mentioned previously, the thermal management system 102 may include the first portion 114 of the thermal interface material 110 disposed in direct or indirect thermal contact with one or more electronic components 108 of the electronic device. The thermal management system 102 may also include a second portion 116 of thermal interface material 110 that may be disposed in direct or indirect thermal contact with the housing 104 (or other thermal ground component) of the electronic device 100. The thermal management system 102 may further include thermal conduit 112 disposed in contact with the first portion 114 and the second portion 116 of the thermal interface material 110 and the thermal conduit 112 may be sized to span a distance between the first portion 114 and the second portion 116 of the thermal interface material 110.

In such an example, the first portion 114 of the thermal interface material 110 draws thermal energy from the one or more electronic components 108 and transfers the thermal energy to the thermal conduit 112. The thermal conduit 112 conducts the thermal energy to the second portion 116 of the thermal interface material 110 where the second portion 116 of the thermal interface material 110 transfers the thermal energy to the thermal ground (such as the housing 104 or other component) where the thermal ground may receive, store, and/or disperse thermal energy.

In some examples, the housing 104 is formed from a material having a high emissivity such that the housing 104 efficiently transfers thermal energy to an environment surrounding the electronic device. For example, the material that forms the housing 104 may include an emissivity coefficient between approximately 0.400 and approximately 0.995, between approximately 0.500 and approximately 0.950, or between approximately 0.700 and approximately 0.900. Additionally, or alternatively, in some examples, the second portion 116 of the thermal interface material 110 may be coupled to a heat spreader that is coupled to the housing 104 and is configured to spread thermal energy across a greater area of the housing 104. Furthermore, in some examples, the second portion 116 of the thermal interface material 110 may be coupled to a heat sink. The heat sink may be disposed within the housing 104 of the electronic device. In such an example, the one or more fans of the electronic device may force air over the heat sink and out of the one or more vents in the housing 104. Alternatively, the heat sink may protrude at least partially through the housing 104 and may exhaust thermal energy directly to an environment surrounding the electronic device.

In some examples, the first portion 114 and the second portion 116 of the thermal interface material 110 may be substantially similar in size. Furthermore, the first portion 114 and the second portion 116 of the thermal interface material 110 may include a thickness (a dimension along the Y-direction) and/or a length (a dimension along the X-direction) between approximately 0.5 mm and approximately 5 mm, between approximately 1 mm and approximately 4 mm, or between approximately 2 mm and approximately 3 mm. However, in some examples, the first portion 114 and the second portion 116 of the thermal interface material 110 may include a thickness and a length greater than or less than the dimensions provided above.

As mentioned previously, the thermal interface material 110 may include a first material 118 and a second material 120 that form the thermal interface material 110. In some examples, the first material 118 may include a thermally conductive silicone matrix that forms a body 202 of the thermal interface material 110. The first material 118 may include a thermal conductivity with a K-value (i.e., watts per meter-Kelvin (W/m-K)) between approximately 1 and approximately 60, between approximately 3 and approximately 40, or between approximately 5 and approximately 20.

In some examples, the first material 118 may include a relatively soft, compressible material having a hardness under about 90A (Shore A) and/or a Young's modulus under 5 GPa. In some examples, the thermal interface material 110 may be compressible such that the thermal interface material 110 may conform to various complex shapes or geometries of the electronic device and/or components thereof. The thermal interface material 110 (and the first material 118) may exhibit plastic and/or elastic deformation when compressed. Furthermore, the first material 118 may exhibit viscoelasticity when undergoing deformation. By compressing the thermal interface material 110, the thermal interface material 110 may fill any air gaps between the thermal interface material 110 and an adjacent component or portion of the electronic device, thereby increasing thermal conductivity therebetween. For example, and as shown in FIG. 2, the second portion 116 of the thermal interface material 110 may be compressed within the housing 104 (or portion thereof) of the electronic device, thereby eliminating gaps between the housing 104 and the second portion 116 of the thermal interface material 110, which, in turn, improves thermal conductivity therebetween.

While described as a silicone matrix, it is to be understood that the first material 118 (and portions thereof) may include additional or other materials including urethane or other hybrid polymer. In some examples, the body 202 of the thermal interface material 110 may have a thickness ranging from 0.5 mm and 2 mm. In examples, the body 202 of the thermal interface material 110 may have a thickness of about 0.5 mm, 0.75 mm, 1 mm, 1.25 mm, 1.50 mm, 1.75 mm, 2 mm or within a range defined by any two of these examples. The body 202 of the thermal interface material 110 may be formed from uniform contiguous layers or layers of patterned material. Furthermore, the first material 118

In some examples, the second material 120 of the thermal interface material 110 may include a plurality of thermally conductive fibers 204. The thermally conductive fibers 204 may be disposed within the body 202 of the thermal interface material 110. In some examples, the thermally conductive fibers 204 may include carbon fibers or graphite fibers. Furthermore, the thermal interface material 110 may include a packing density of the thermally conductive fibers 204 between approximately 30% and approximately 70% or between approximately 40% and approximately 60% volume fraction (where approximately is +/−10%). In such an example, the first material 118 comprises the remaining volume fraction.

In some examples, the thermally conductive fibers 204 include a thermal conductivity that is greater than the thermal conductivity of the first material 118 and, as such, the thermally conductive fibers 204 may improve the thermal conductivity of the thermal interface material 110. For example, the thermal conductivity of the thermal interface material 110 with the thermally conductive fibers 204 disposed therein may have a K-value between approximately 10 and approximately 80, between approximately 20 and approximately 70, or between approximately 30 and approximately 50. In some examples, the thermally conductive fibers 204 may have a higher thermal conductivity in an axial direction (along their length or in the Y-direction) than in a radial direction (perpendicular to their length or in the X-direction).

Furthermore, in some examples, individual fibers of the thermally conductive fibers 204 may be at least partially coated with an electrically conductive material. For example, individual fibers of the thermally conductive fibers 204 may be at least partially coated with copper, silver, or other conductive material. Coating the thermally conductive fibers 204 may provide electrical grounding or shunting within the electronic device. Additionally, or alternatively, at least a portion of the body 202 of the thermal interface material 110 may be coated with the conductive material (as shown and described in FIG. 3).

In some examples, and as shown in FIG. 2, the thermally conductive fibers 204 may be aligned such that individual thermally conductive fibers extend in a same (or a substantially similar) direction. For example, the thermally conductive fibers 204 may be aligned such that a length of the fibers extend in the Y-direction. As such, the plurality of thermally conductive fibers 204 may be substantially parallel to each other when the thermal interface material 110 is uncompressed. Furthermore, the thermally conductive fibers 204 may extend across (or substantially across) a dimension (e.g., length, width, or height) of the body 202 of the thermal interface material 110. In such an example, a length of individual fibers of the thermally conductive fibers 204 may be substantially equal to (e.g., within 1 mm, 0.5 mm, 0.1 mm, 50 microns, 20 microns, etc.) a dimension of the body 202 of the thermal interface material 110. In FIG. 2, a length of individual fibers of the thermally conductive fibers 204 is depicted as being substantially equal to a thickness (or height) of the body 202 of the thermal interface material 110. In some examples, a length of individual fibers of the thermally conductive fibers 204 may be equal to or greater than approximately 0.5 mm. Furthermore, a diameter of individual fibers of the thermally conductive fibers 204 may be between approximately 5 microns and approximately 100 microns, between approximately 10 microns and approximately 75 microns, or between approximately 15 microns and approximately 50 microns.

By aligning the thermally conductive fibers 204 and sizing such thermally conductive fibers 204 to extend substantially across a dimension of the body 202 of the thermal interface material 110, a thermal energy pathway is formed by which thermal energy may be transferred across the thermal interface material 110 and/or transferred to the thermal conduit 112. Furthermore, the thermal energy may be transferred across the thermal interface material 110 via conduction as the thermal energy is transferred along a length of individual thermally conductive fibers 204 of the plurality of thermally conductive fibers 204. As such, the thermal interface material 110 described herein may transfer thermal energy with greater efficiency than conventional thermal interface material that includes added particles.

In some examples, the thermal interface material 110 may be overmolded (or otherwise disposed) on ends of the thermal conduit 112. For example, the first portion 114 of the thermal interface material 110 is overmolded a first end of the thermal conduit 112 and the second portion 116 is overmolded a second end of the thermal conduit 112. In some examples, the first portion 114 and the second portion 116 of the thermal interface material 110 may form a first end and a second end of the thermal conduit 112, respectively.

In such examples, the thermal conduit 112 forms a thermal pathway disposed between the first portion 114 and the second portion 116 of the thermal interface material 110. The thermal conduit 112 may include a first material 122 and a second material 124. The first material 122 may extend along an axial length (along the X-direction) of the thermal conduit 112. In some examples, the first material 122 may be formed from pyrolytic graphite. The pyrolytic graphite may form a core of the thermal conduit 112 as pyrolytic graphite has a high thermal conductivity.

The first material 122 may be relatively thin and flexible such that the first material 122 may be shaped to conform to various complex geometries within an electronic device. For example, a thickness (a dimension of the first material 122 in the Y-direction) may be between approximately 20 microns and approximately 120 microns, between approximately 30 microns and approximately 110 microns, or between 40 microns and approximately 100 microns. Furthermore, a length (a dimension of the first material 122 in the X-direction) of the first material 122 may be sized to accommodate any space between components of the electronic device. For example, the length of the first material may be between approximately 10 mm and approximately 300 mm. However, in some examples, the first material 122 may be shorter than or longer than the dimensions described above.

The thermal conduit 112 may also includes the second material 124 that at least partially encases the first material 122. The second material 124 may likewise extend along an axial length of the thermal conduit 112. In some examples, the second material 124 is bonded, adhered, or otherwise coupled to the first material 122. In some examples, the second material 124 may include a length that is substantially similar to the first material 122 such that the second material 124 coats or encases the first material 122. However, the first material 122 may include one or more surfaces that are substantially free from the second material 124.

In some examples, the second material 124 may encapsulate the first material 122 as the first material 122 may be prone to flaking. As such, the second material 124 may mitigate and/or prevent contamination from the first material 122 flaking within the electronic device. The second material 124 may also provide structural support for the thermal conduit 112 while also providing flexibility along with the first material 122, thereby allowing the thermal conduit 112 to be implemented in tight and/or complex geometries within an electronic device. Still further, the second material 124 may provide a surface to which the thermal interface material 110 may be bonded or adhered. In some examples, the thermal interface material 110 may bond or adhere poorly to pyrolytic graphite due to its material properties. As such, the second material 124 provides a surface to which the thermal interface material 110 may bond or adhere to well, while also allowing the first material 122 to be in thermal contact with the thermal interface material 110, thereby maintaining high thermal conductivity of the thermal management system 102.

In some examples, the second material 124 may be copper or polyethylene terephthalate (PET). In some examples, the second material 124 may be wetted to the first material 122 to bond or adhere the second material 124 to the first material 122. Such wetting may improve a bond between the second material 124 and the first material 122. Additionally, and/or alternatively, the second material 124 may be adhered to the first material 122 via a pressure sensitive adhesive (PSA).

Figure 3:
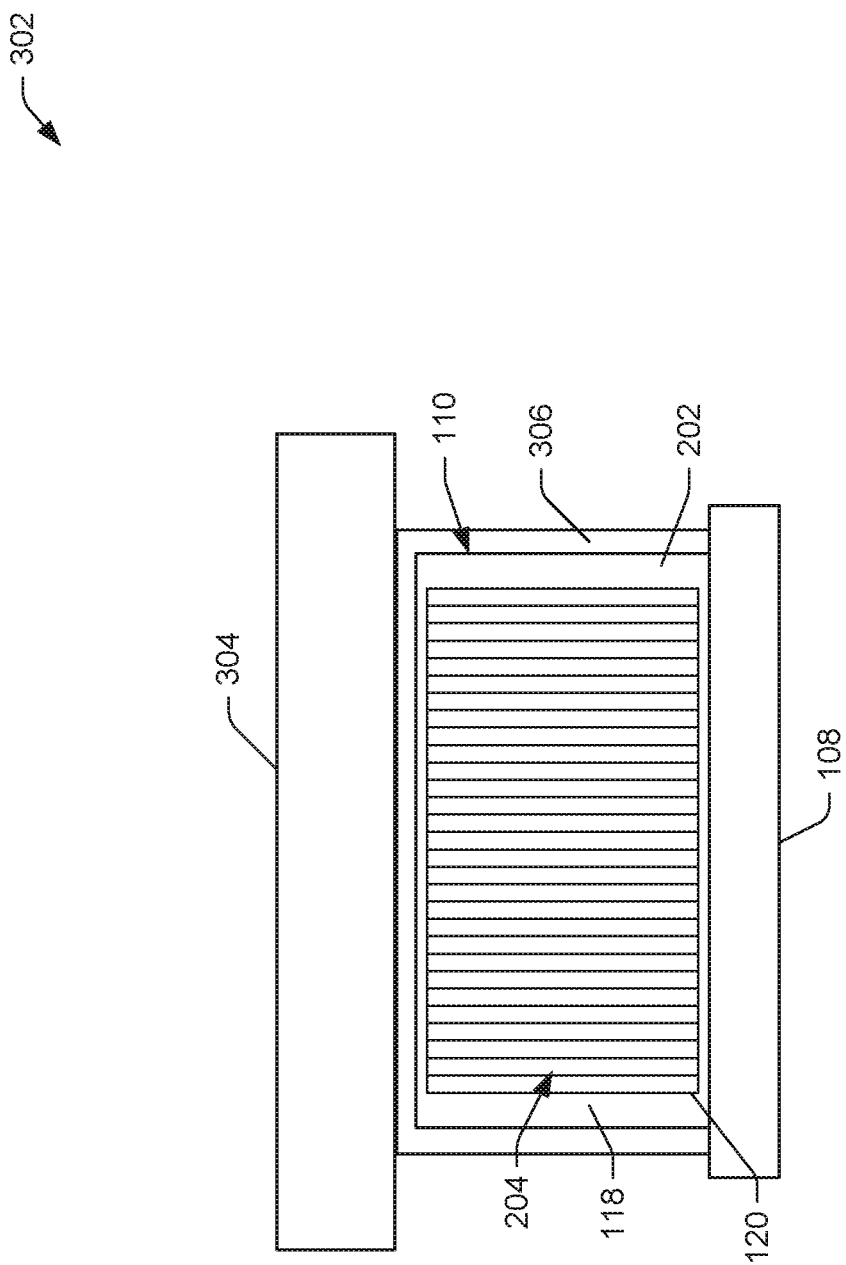
FIG. 3 illustrates a schematic view of another thermal management system in accordance with an example of the present disclosure.

FIG. 3 illustrates a schematic view of another example thermal management system 302. It is noted that FIG. 3 is not drawn to scale and various components illustrated in FIG. 3 may be relatively larger or smaller than depicted. FIG. 3 depicts an alternate configuration of the thermal interface material 110 that may be implemented in a thermal management system 302. The thermal management system 302 may be the same as the thermal management system 102 shown and described in FIGS. 1 and 2 or the thermal management system 302 shown in FIG. 3 may be different. In either example, the thermal management system 302 shown and described may be implemented in the electronic device 100 (or in similar devices).

The thermal management system 302 may include the thermal interface material 110 having the first material 118 and the second material 120. The thermal interface material 110 may be directly or indirectly thermally coupled to one or more electronic components 108 of the electronic device 100. The thermal interface material 110 may further be directly or indirectly coupled to a thermal ground 304. In some examples, the thermal ground 304 may include one or more thermal frames, heat sinks, cooling blocks, radiators, heat pipes, vapor chambers, portion(s) of the housing 104, or other components configured to manage thermal energy within the electronic device. In such a configuration, the thermal interface material 110 is configured to draw thermal energy from the one or more electronic components 108 and to transfer the thermal energy to the thermal ground 304 of the thermal management system 302. In turn, the thermal ground 304 may spread the thermal energy across the thermal ground 304 within the electronic device and/or dissipate the thermal energy to an environment outside of the housing 104.

Furthermore, the thermal interface material 110 may be at least partially coated with an electrically conductive material 306. For example, a portion of the body 202 of the thermal interface material 110 may be coated with the electrically conductive material 306. In some examples, less than all sides of the thermal interface material 110 may be coated with the electrically conductive material 306, as shown in FIG. 3. Alternatively, in some examples, all sides of the thermal interface material 110 may be coated with the conductive material 306. Additionally, or alternatively, individual fibers of the thermally conductive fibers 204 may be at least partially coated with the electrically conductive material 306. At least partially coating the thermal interface material 110 may provide electrical grounding or shunting within the electronic device.

Figure 4:
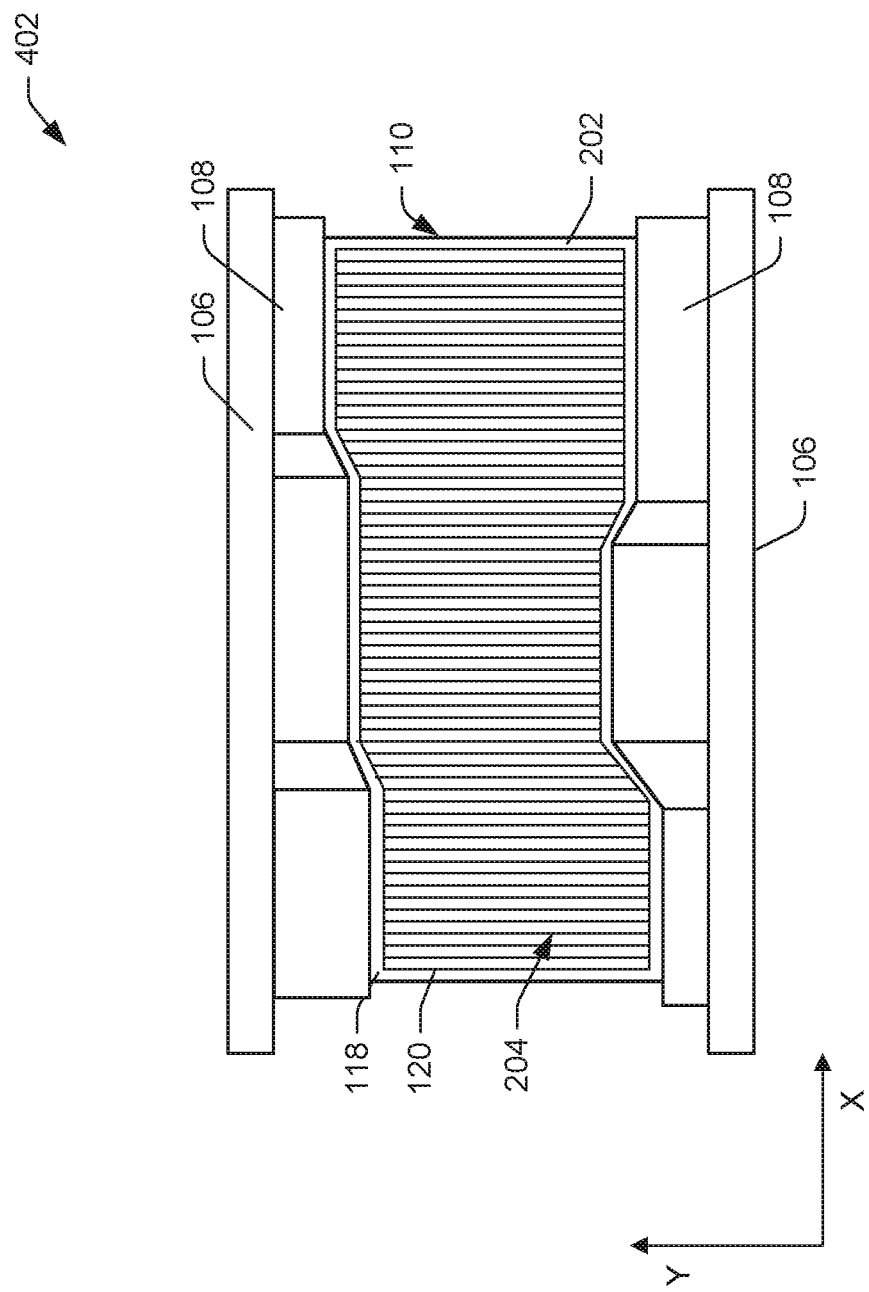
FIG. 4 illustrates a schematic view of another thermal management system in accordance with an example of the present disclosure.

FIG. 4 illustrates a schematic view of another example thermal management system 402. It is noted that FIG. 4 is not drawn to scale and various components illustrated in FIG. 4 may be relatively larger or smaller than depicted. FIG. 4 depicts an alternate configuration of the thermal interface material 110 that may be implemented in a thermal management system 402. The thermal management system 402 may be the same as the thermal management system 102 shown and described in FIGS. 1 and 2 or the thermal management system 402 shown in FIG. 4 may be different. In either example, the thermal management system 402 shown and described may be implemented in the electronic device 100 (or in similar devices).

As mentioned previously, the thermal interface material 110 may be compressible. As such, the thermal interface material 110 may conform to various complex shapes or geometries of an electronic device and/or components thereof. By compressing the thermal interface material 110, the thermal interface material 110 may fill any air gaps between the thermal interface material 110 and an adjacent component or portion of the electronic device, thereby increasing thermal conductivity therebetween.

As shown in FIG. 4, the thermal interface material 110 may be disposed between adjacent PCBs 106 with various electronic components 108 disposed thereon. The various electronic components may include varying heights and the thermal interface material 110 may be at least partially compressed between the adjacent PCBs 106 to accommodate the varying heights of the electronic components. As such, the thermal interface material 110 may draw thermal energy from the various electronic components 108. Additionally, the thermal interface material 110 may be coupled to a thermal conduit (such as the thermal conduit 112 shown and described in FIGS. 1 and 2) and/or to a thermal ground and the thermal interface material 110 may draw thermal energy from the various electronic components 108 and transfer the thermal energy to the thermal ground.

Figure 5:
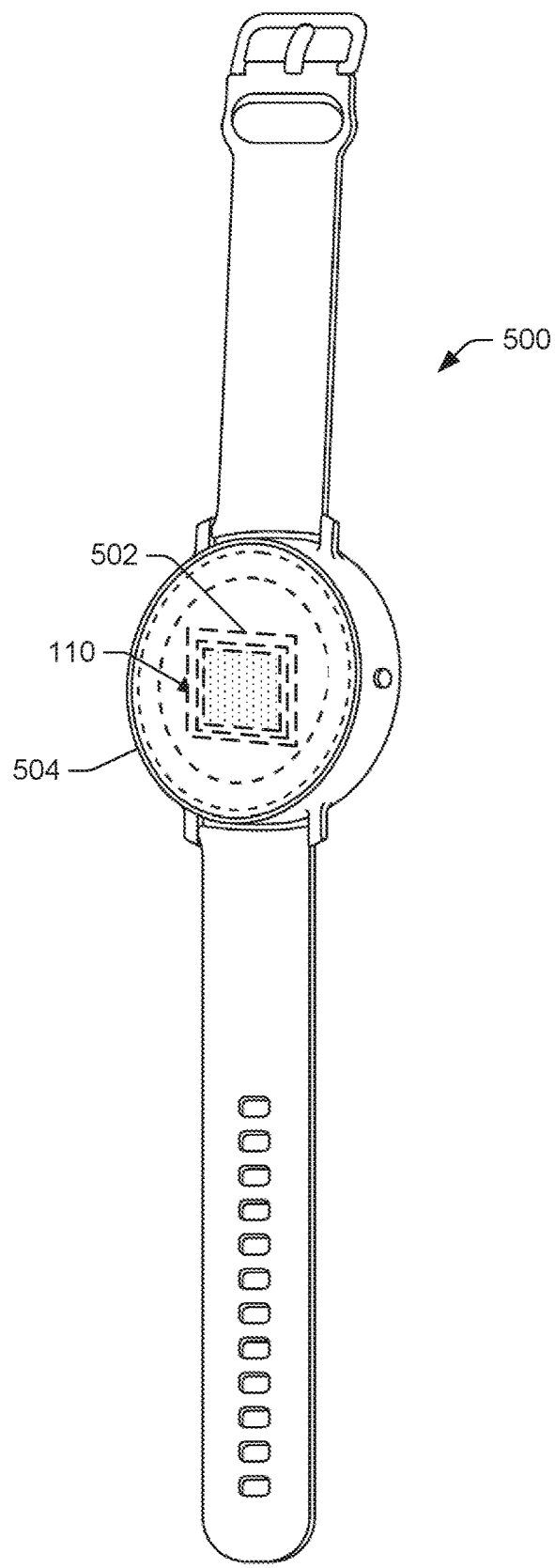
FIG. 5 illustrates a perspective view of another electronic device having a thermal management system in accordance with an example of the present disclosure.

FIG. 5 illustrates another example electronic device 500 having the thermal interface material 110 disposed therein. The thermal interface material 110 shown in FIG. 5 may be substantially similar to the thermal interface material 110 shown and described with respect to FIGS. 1-4. As shown in FIG. 5, the electronic device 500 may include a wrist wearable device (e.g., a smartwatch, fitness band, or controller), a hand wearable device, a head-mounted device (e.g., an electronic headset device), or other wearable device.

Similar to the electronic device 100 described above, the electronic device 500 of FIG. 5 includes a heat source 502 (e.g., one or more processors, radios, and/or other electronics) located within a housing 504 of the electronic device 500. The thermal interface material 110 may be configured to draw thermal energy from the heat source 502 and to transfer the thermal energy to the housing 504 of the electronic device 500.

CONCLUSION

Although the discussion above sets forth example implementations of the described techniques and structural features, other architectures may be used to implement the described functionality and are intended to be within the scope of this disclosure. Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims. For example, the structural features and/or methodological acts may be rearranged and/or combined with each other and/or other structural features and/or methodological acts. In various examples, one or more of the structural features and/or methodological acts may be omitted.

What is claimed is:

1. An electronic device comprising:
   an electronic component;
   a thermal ground;
   a first portion of thermal interface material comprising:
      a first body comprising thermally conductive silicone, the first body disposed in thermal contact with the electronic component, and
      a first plurality of thermally conductive fibers disposed within the first body of the first portion of thermal interface material;
   a second portion of thermal interface material comprising:
      a second body disposed in thermal contact with the thermal ground, and
      a second plurality of thermally conductive fibers disposed within the second body; and
   a thermal conduit coupled to the first portion of thermal interface material and the second portion of thermal interface material and spanning a distance therebetween.

2. The electronic device of claim 1, wherein the first portion of thermal interface material is at least partially compressible such that the first portion of thermal interface material conforms to a geometry of the electronic device.

3. The electronic device of claim 1, wherein the thermal ground comprises a housing, vapor chamber, heat sink, thermal spreader, or thermal frame of the electronic device.

4. The electronic device of claim 1, wherein the first plurality of thermally conductive fibers comprise carbon fibers or graphite fibers.

5. The electronic device of claim 1, wherein the first plurality of thermally conductive fibers are substantially parallel to one another, such that individual thermally conductive fibers of the first plurality of thermally conductive fibers include a length extending in a same direction.

6. The electronic device of claim 5, wherein the first portion of thermal interface material includes a thickness extending in a first direction, and the first plurality of thermally conductive fibers are oriented in the first direction such that the first plurality of thermally conductive fibers are parallel to the thickness of the thermal interface material.

7. The electronic device of claim 1, wherein the first portion of thermal interface material includes a thickness, and the first plurality of thermally conductive fibers extend across the thickness of the first portion of thermal interface material.

8. The electronic device of claim 1, wherein the first portion of thermal interface material is over molded on a first end of the thermal conduit and the second portion of thermal interface material is over molded on a second end of the thermal conduit.

9. The electronic device of claim 1, further comprising:
   a fan positioned within a housing of the electronic device, the fan oriented to blow air across the second portion of thermal interface material.

10. A wearable device comprising:
    a housing;
    an electronic component disposed within the housing; and
    a first portion of thermal interface material disposed within the housing such that the first portion of thermal interface material is disposed in thermal contact with the electronic component, wherein the first portion of thermal interface material includes:
       a first body comprising thermally conductive silicone having a first thermal conductivity, the first body disposed in thermal contact with the electronic component, and
       a first plurality of thermally conductive fibers disposed within the first body of the first portion of thermal interface material, the first plurality of thermally conductive fibers having a second thermal conductivity that is greater than the first thermal conductivity;
    a second portion of thermal interface material comprising:
       a second body disposed in thermal contact with a thermal ground, and a second plurality of thermally conductive fibers disposed within the second body; and a thermal conduit coupled to the first portion of thermal interface material and the second portion of thermal interface material and spanning a distance therebetween.

11. The wearable device of claim 10, wherein the first plurality of thermally conductive fibers are carbon fibers.

12. The wearable device of claim 10, wherein the first plurality of thermally conductive fibers are substantially parallel to one another, such that individual thermally conductive fibers of the first plurality of thermally conductive fibers include a length extending in a same direction.

13. The wearable device of claim 10, wherein individual thermally conductive fibers of the first plurality of thermally conductive fibers include a diameter that is equal to or less than 75 microns.

14. The wearable device of claim 10, wherein the first portion of thermal interface material is compressible.

15. The wearable device of claim 10, wherein the thermal ground comprises a thermal spreader, heat sink, vapor chamber, or thermal frame.

16. The wearable device of claim 10, wherein the thermal conduit is flexible.

17. A thermal management system comprising:
   a first portion of thermal interface material comprising:
      a first body comprising thermally conductive silicone, the first body disposed in thermal contact with a thermal energy generating component, and the thermally conductive silicone having a first thermal conductivity, and
      a first plurality of thermally conductive fibers disposed within the first body of the first portion of thermal interface material, the first plurality of thermally conductive fibers having a second thermal conductivity that is greater than the first thermal conductivity;
   a second portion of thermal interface material comprising:
      a second body disposed in thermal contact with a thermal ground, and
      a second plurality of thermally conductive fibers disposed within the second body; and
   a thermal conduit coupled to the first portion of thermal interface material and the second portion of thermal interface material and spanning a distance therebetween.

18. The thermal management system of claim 17, wherein individual thermally conductive fibers of the first plurality of thermally conductive fibers are at least partially coated with an electrically conductive material.

19. The thermal management system of claim 17, wherein the first plurality of thermally conductive fibers form between 40% and 60% volume fraction of the thermal interface material.

20. The thermal management system of claim 17, wherein the first plurality of thermally conductive fibers are substantially parallel to one another, such that individual thermally conductive fibers of the first plurality of thermally conductive fibers include a length extending in a same direction.

* * * * *